(12) United States Patent
Koschel et al.

(10) Patent No.: US 12,176,894 B2
(45) Date of Patent: Dec. 24, 2024

(54) HAND-HELD MACHINE TOOL AND RELATED METHOD

(71) Applicant: Hilti Aktiengesellschaft, Schaan (LI)

(72) Inventors: Christian Koschel, Augsburg (DE); Christian Ruff, Stadtbergen (DE); Stefan Schwarz, Landsberg (DE); Georg Fürfanger, Munich (DE)

(73) Assignee: Hilti Aktiengesellschaft, Schaan (LI)

( * ) Notice: Subject to any disclaimer, the term of this patent is extended or adjusted under 35 U.S.C. 154(b) by 265 days.

(21) Appl. No.: 17/918,969

(22) PCT Filed: Apr. 20, 2021

(86) PCT No.: PCT/EP2021/060221
§ 371 (c)(1),
(2) Date: Oct. 14, 2022

(87) PCT Pub. No.: WO2021/219436
PCT Pub. Date: Nov. 4, 2021

(65) Prior Publication Data
US 2023/0060201 A1 Mar. 2, 2023

(30) Foreign Application Priority Data
Apr. 29, 2020 (EP) .................................. 20172088

(51) Int. Cl.
*H03K 17/955* (2006.01)
*H03K 17/96* (2006.01)
(52) U.S. Cl.
CPC ....... *H03K 17/955* (2013.01); *H03K 17/9622* (2013.01)

(58) Field of Classification Search
CPC ..................... H03K 17/955; H03K 17/9622
See application file for complete search history.

(56) References Cited

U.S. PATENT DOCUMENTS

2022/0055166 A1    2/2022   Dennis et al.

FOREIGN PATENT DOCUMENTS

| DE | 102007043035 A1 | 3/2009 |
| DE | 102016214191 A1 | 2/2018 |

(Continued)

OTHER PUBLICATIONS

International Search Report of PCT/EP2021/060221 dated Apr. 20, 2021.

(Continued)

*Primary Examiner* — Michelle Lopez
(74) *Attorney, Agent, or Firm* — Davidson Kappel LLC

(57) ABSTRACT

A method is provided for operating a hand-held machine tool including a drive device, with a control device for actuating the drive device and at least two capacitive sensor elements operatively connected to the control device being provided. The method includes the following method steps of determining a first and second electrical charge of the first and second sensor element comparing the determined first electrical charge with a defined first threshold value and the determined second electrical charge with a defined second threshold value which differs from the first threshold value; enabling, via the control device, the actuation of the drive device when the first electrical charge is greater than the defined first threshold value and/or the second electrical charge is greater than the defined second threshold value. A machine tool for carrying out a method of this kind is also described.

12 Claims, 9 Drawing Sheets

(56) References Cited

FOREIGN PATENT DOCUMENTS

| | | |
|---|---|---|
| DE | 102018108068 A1 | 10/2019 |
| DE | 102018216573 A1 | 4/2020 |
| EP | 3444832 A1 | 2/2019 |
| WO | WO 2008104406 A2 | 9/2008 |
| WO | WO 2021/219433 A1 | 11/2021 |
| WO | WO 2021/219436 A1 | 11/2021 |
| WO | WO 2021/219437 A1 | 11/2021 |
| WO | WO 2021/219439 A1 | 11/2021 |
| WO | WO 2021/219440 A1 | 11/2021 |

OTHER PUBLICATIONS

U.S. Appl. No. 17/918,487, filed Oct. 12, 2022 which is a National Phase Application of PCT/EP2021/060224 (published as WO 2021/219437 A1), filed Apr. 20, 2021.
U.S. Appl. No. 17/918,522, filed Oct. 12, 2022 which is a National Phase Application of PCT/EP2021/060212 (published as WO 2021/219433 A1), filed Apr. 20, 2021.
U.S. Appl. No. 17/918,734, filed Oct. 13, 2022 which is a National Phase Application of PCT/EP2021/060232 (published as WO 2021/219440 A1), filed Apr. 20, 2021.
U.S. Appl. No. 17/918,844, filed Oct. 13, 2022 which is a National Phase Application of PCT/EP2021/060227(published as WO 2021/219439 A1), filed Apr. 20, 2021.

HAND-HELD MACHINE TOOL AND RELATED METHOD

The invention relates to a method for actuating a hand-held machine tool comprising a drive device by means of which a tool that can be brought into operative connection with the machine tool can be actuated, with a control device for actuating the drive device and at least two capacitive sensor elements operatively connected to the control device being provided. The invention further relates to a hand-held machine tool for carrying out such a method.

BACKGROUND

Hand-held machine tools designed with a capacitive sensor are known from practice. By means of the capacitive sensor, for example, a power switch can be enabled and a drive device can then be actuated via a switch that can be actuated by a user. A so-called dead man function can be provided by means of the capacitive sensor. The capacitive sensor is arranged in a grip region of the machine tool, for example, and can detect a user's hand located in the grip region.

It is also known to provide a plurality of such capacitive sensors arranged in different regions of the machine tool, with a detection by a sensor enabling a user actuation of a switch an operation of the machine tool.

SUMMARY OF THE INVENTION

Such a method can, however, lead to incorrect detections.

It is an object of the present invention to provide a method for actuating a hand-held machine tool and a hand-held machine tool with which the risk of an incorrect detection by a capacitive sensor device can be reduced.

A method is thus provided for actuating a hand-held machine tool which comprises a drive device by means of which a tool that can be brought into operative connection with the machine tool can be actuated, with a control device for actuating the drive device and at least two capacitive sensor elements operatively connected to the control device being provided.

The method is characterized by the following method steps:
- determining a first electrical charge of the first sensor element,
- determining a second electrical charge of the second sensor element,
- comparing the determined first electrical charge of the first sensor element with a defined first threshold value;
- comparing the determined second electrical charge of the second sensor element with a defined second threshold value which differs from the first threshold value;
- enabling, via the control device, the actuation of the drive device when the first electrical charge of the first sensor element is greater than the defined first threshold value and/or the second electrical charge of the second sensor element is greater than the defined second threshold value.

A method according to the invention for actuating a hand-held machine tool is advantageous in that the risk of an incorrect detection by a sensor element can be reduced in a simple manner. This is achieved by the selection of the differing threshold values, which are individually selected on the basis of the framework or ambient conditions of the relevant sensor element. If a sensor element is located in a region of the machine tool in which there are large interfering influences, for example in the vicinity of the drive device or in the vicinity of metal objects, a higher threshold value can be selected than for a sensor element arranged in a region of the machine tool that is remote from the drive device.

For example, it can be provided that the relevant defined threshold value is composed of the sum of a contact value that is substantially identical for all sensor elements and a basic signal value that is dependent on the respective ambient conditions. The basic signal value is in particular higher the greater the interference in the region of the relevant sensor element.

The presence of a user's hand in a detection region of the sensor element, for example in the grip region or in a holding region, can be determined by means of the sensor element and the control device. The presence of a hand can be detected, for example, by the fact that, when charged with a constant voltage, the sensor element can absorb a greater electrical charge due to the hand. It can be provided, for example, that the sensor element is alternately charged and discharged and the presence of a hand is assumed when a defined threshold value for the determined electrical charge is exceeded.

The hand-held machine tool can relate to all kinds of hand-held machine tools, such as grinding machines, for example angle grinders, sawing machines, such as reciprocating saws, jigsaws, circular saws or chain saws, drills, chisel hammers or the like.

In an advantageous embodiment of a method according to the invention, it can be provided that a threshold value, for example the first threshold value, is set or calibrated on the basis of another threshold value, for example the second threshold value. As a result, the first threshold value, which is in particular the threshold value of the sensor device which is arranged in the region exposed to greater interference, can be modified in a simple manner, for example to changing ambient conditions. The first threshold value can be set in such a way that the risk of an incorrect detection is minimized and a detection is reliably recognized in the case of user actuation.

Alternatively, it can also be provided that threshold values are mutually calibrated.

In an advantageous embodiment of a method according to the invention, it can be provided that the first threshold value is set or calibrated on the basis of the second threshold value at defined time intervals or continuously during operation of the machine tool.

To determine the electrical charge of a sensor element, the following steps are carried out in an advantageous embodiment of a method according to the invention:
- charging the relevant sensor element in particular up to a defined voltage
- discharging the relevant sensor element and determining an electrical charge of the relevant sensor element by means of the control device.

The control device is designed to detect changes in charge in the at least one sensor element, whereby, for example, the presence of a hand is detected if the determined charge is greater than a defined threshold value. Such changes in the determined charge occur, for example, when a users hand is in a defined region of the machine tool, since this increases the overall capacitance. The control device then preferably enables the operation of the machine tool in response to a user request. To determine the actual electrical charge of a sensor element, a capacitor of the control device that has a small capacitance compared to a capacitance of the sensor element can be provided, which capacitor is fully charged with the electrical charge of the sensor element and then discharged, and the number of processes is counted until the relevant sensor element is completely discharged. If a defined threshold value for the number of these processes is exceeded, this can be interpreted as the presence of a hand. The control device can be designed with a control element, the at least one sensor element being operatively connected to the control element. The control element is connected to a main control unit of the control device in particular via lines and can thereby be arranged at a distance from the main control unit.

The present invention also provides a hand-held machine tool for carrying out such a method, which comprises a drive device by means of which a tool that can be brought into operative connection with the machine tool can be actuated, with a control device for actuating the drive device being provided, with at least two sensor elements connected to the control device being provided.

The advantages listed in connection with the method for actuating a hand-held machine tool also apply analogously to a hand-held machine tool designed according to the invention, in which the risk of an incorrect detection is reduced and, in addition, a user actuation is reliably detected.

In an advantageous embodiment of a hand-held machine tool according to the invention, the sensor elements or detection regions of the sensor elements can be arranged in any desired regions of the machine tool and the desired functionality can be ensured by individually selecting the threshold values. It can be provided, for example, that a first sensor element is arranged in a region of the machine tool in which the drive device is arranged. Furthermore, it can be provided that a second sensor element is arranged in a region of the machine tool remote from the drive device.

The control device can be designed with a control element, the at least one sensor element being operatively connected to the control element. The control element is connected to a main control unit of the control device in particular via lines and can thereby be arranged at a distance from the main control unit.

The at least one sensor element and the control device, in particular the control element, are preferably part of a capacitively measuring sensor. The control element is preferably designed as a printed circuit board and has a control unit and a signal generator, the signal transmitter being designed in particular to charge the sensor elements, which are designed for example as lines, with a defined voltage. The control unit is preferably designed to detect changes in charge in the at least one sensor element, whereby, for example, the presence of a hand is detected if the determined charge is greater than a defined threshold value. Such changes in the determined charge occur, for example, when a users hand is in a defined region of the machine tool, since this increases the overall capacitance. The control element then sends in particular a signal to the control device, which then preferably enables the operation of the machine tool in response to a user request. To determine the actual electrical charge of a sensor element, a capacitor having a small capacitance compared to a capacitance of the sensor element can be provided, which capacitor is fully charged with the electrical charge of the sensor element and then discharged, and the number of processes is counted until the relevant sensor element is completely discharged. If a defined threshold value for the number of these processes is exceeded, this can be interpreted as the presence of a hand.

In an advantageous embodiment of a machine tool according to the invention, a power switch that is operatively connected to the control device and can be actuated by a user can be provided, the control device being designed to transfer the power switch between an inactive state and an active state, with a user actuation of the power switch in the active state of the power switch leading to an actuation of the drive device. By means of the control device, the power switch can in particular thus be actuated in such a way that a user actuation of an actuating element that is operatively connected to the power switch leads to the coupling of the drive device with current, for example from a storage battery or from a mains supply, and thus to the actuation of the drive device. In a simple manner, the situation can be achieved whereby the machine tool can only be actuated when a hand located for example in the grip region can be detected by means of the control device in cooperation with the at least one capacitive sensor element and/or the control element. It can also be provided that the power switch in the active state is transferred to the inactive state if the control device in cooperation with the at least one capacitive sensor element and/or the control element no longer detects a hand in the grip region. A so-called dead man function can thus be implemented in a simple manner. In the active state, the power switch is designed to guide a motor current to the drive device, as a result of which the tool can be actuated.

BRIEF DESCRIPTION OF THE DRAWINGS

Further advantages can be found in the following description of the drawings. An embodiment of the present invention is shown in the drawings. The drawings, the description and the claims contain numerous features in combination. A person skilled in the art will expediently also consider the features individually and combine them to form meaningful further combinations.

In the drawings.

DETAILED DESCRIPTION

Figure 1:
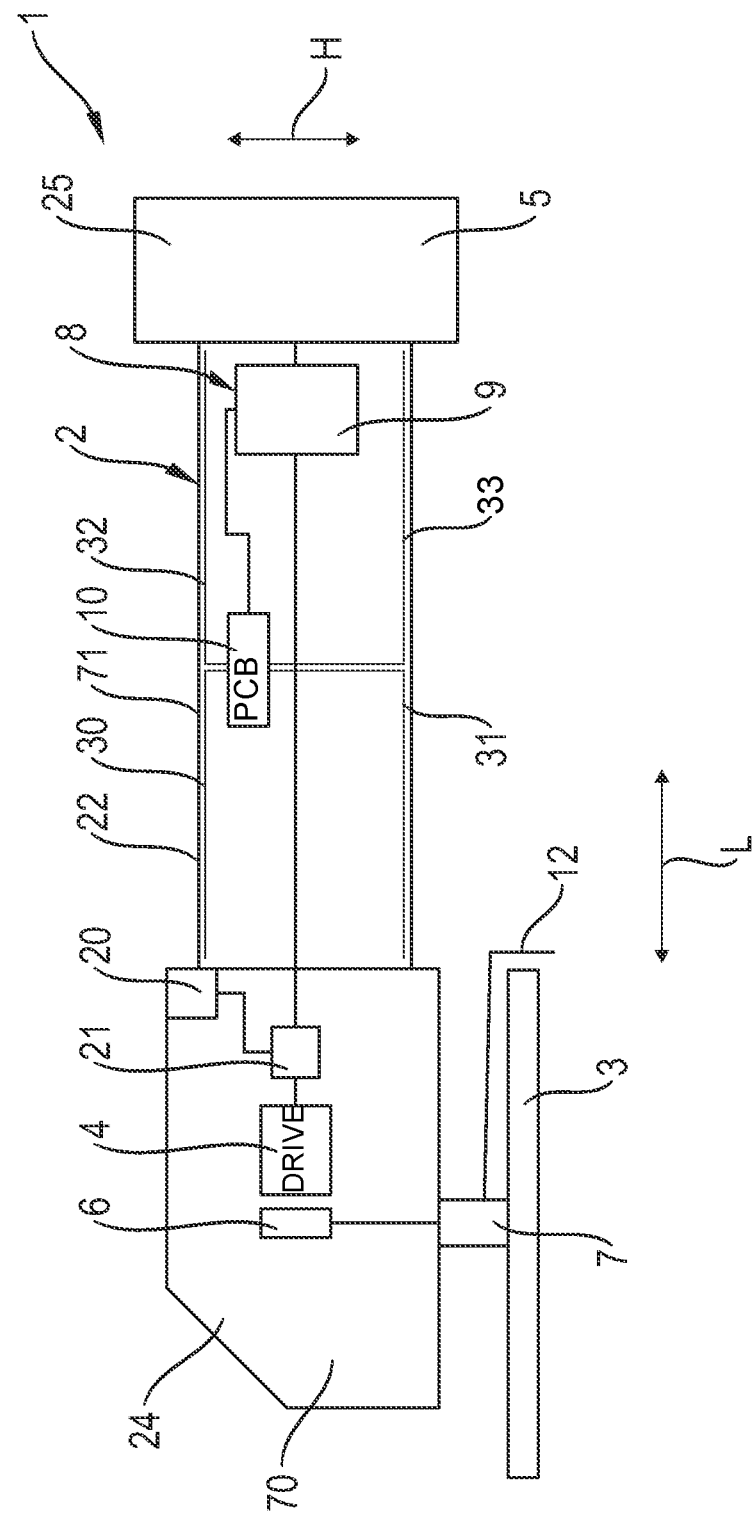
FIG. 1 is a greatly simplified longitudinal sectional view of a hand-held machine tool designed as an angle grinder, with a tool being arranged on a driven shaft of the angle grinder.
Figure 2:
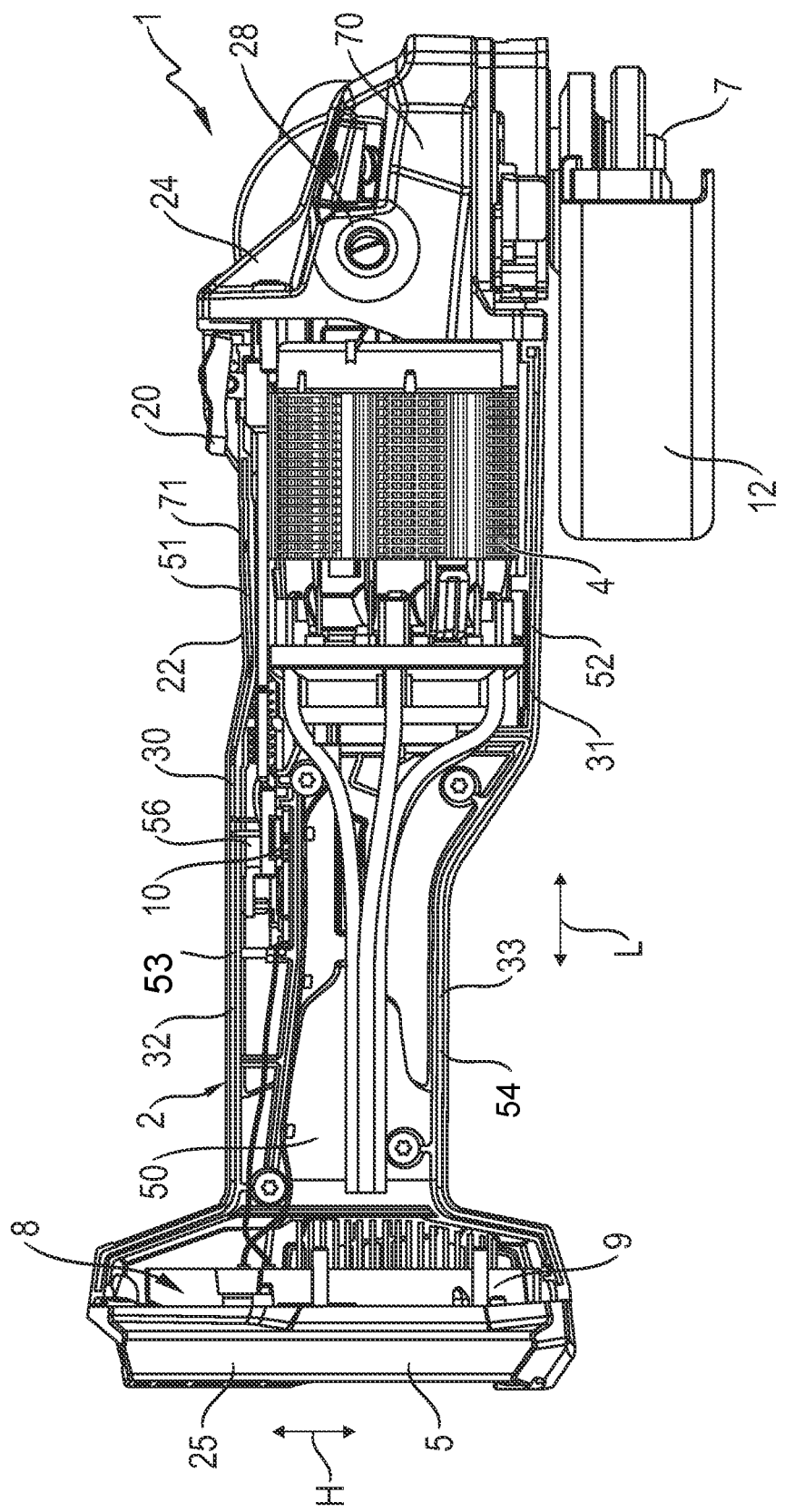
FIG. 2 is a longitudinal sectional view of the angle grinder according to FIG. 1.

FIG. 1 to FIG. 7 and FIG. 9 show a hand-held machine tool 1 according to the invention which is designed as an angle grinder in the illustration shown. According to an alternative embodiment, the machine tool 1 can also be designed as a drill, a hammer drill, a saw, a chisel hammer or the like.

The machine tool 1, which is designed as an angle grinder in the drawings, has a housing 2 and a tool 3 which is designed as a cutting disk or grinding wheel, for example, and can be releasably connected to a driven shaft 7 of the machine tool 1. The tool 3 can be actuated by a drive or a drive device 4 which is in particular designed as an electric motor and can be supplied with current in particular by means of a storage battery 5 that can be connected to the machine tool 1. The storage battery 5, like the housing 2, is not shown in all of the drawings.

According to an alternative embodiment, the machine tool 1 can also be supplied with electric current from a network by means of a power cable.

The drive device 4 for actuating the tool 3, in this case in a rotating movement, is arranged in an interior of the housing 2 along with a gear mechanism 6. The drive 4, which is designed for example as an electric motor, the gear mechanism 6 and the driven shaft 7 to which the tool 3 is operatively connected are arranged relative to one another and are interconnected in such a way that a torque generated by the electric motor 4 can be transmitted to the gear mechanism 6 and finally to the driven shaft 7. A freely rotating end of the driven shaft 7 which in this case projects downward from the housing 2 is connected to the tool, which is designed here as a cutting disk 3, for example via a clamping device (not shown in more detail). The torque of the driven shaft 7 is thus transmitted directly to the cutting disk 3.

A protective device designed as a protective hood 12 is provided and can preferably be releasably connected to the housing 2 of the machine tool 1 in a conventionally known manner and can be provided to protect a user when the machine tool 1 is in operation.

The housing 2 has at least one holding region 22 or grip region which is provided for holding and guiding the machine tool 1 by one or both hands of a user. A switch 20 which can be actuated by a user when the machine tool 1 is held in the grip region 22 is associated with the holding region 22.

Figure 7:
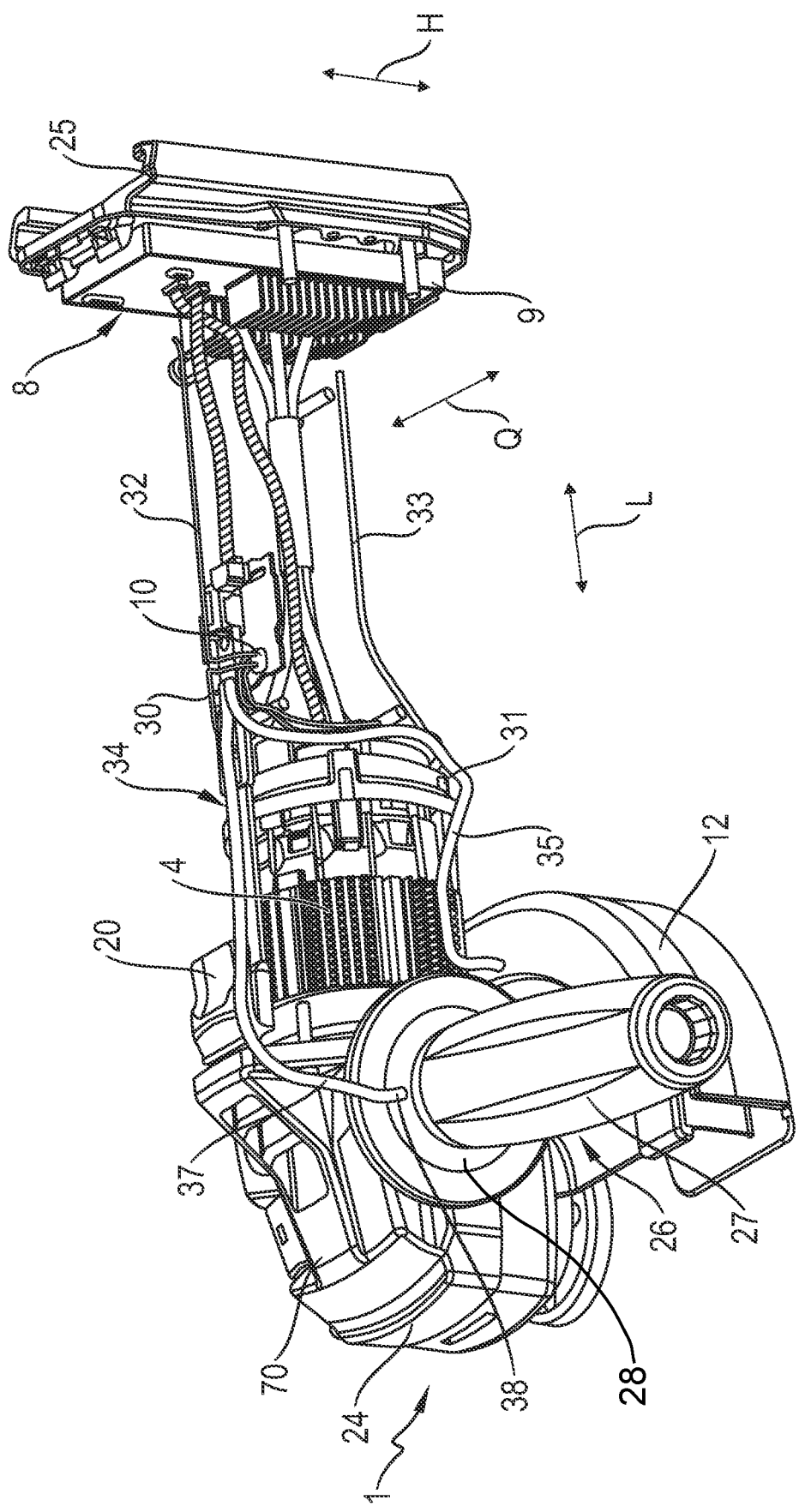
FIG. 7 is a simplified three-dimensional view of the angle grinder according to FIGS. 1 to 6 without part of a housing, with an additional grip being shown.

As an alternative or in addition to this, the machine tool 1 can have a further grip device 26 (see, for example FIG. 7) which, for example in a head region 24 of the machine tool 1 that faces the tool 3, can be releasably brought into operative connection with the housing 2 of the machine tool 1 and provides a different working position for the user, for example. FIG. 7 shows an additional grip 26 of this type, which can be releasably connected to the housing 2 in the region of a connection point 28.

The machine tool 1 also has a control device 8 which is designed in this case with main control electronics 9 and a control element 10. The control element 10 is preferably designed as a printed circuit board and is electrically and electronically connected to the main control electronics 9, which in the present case are arranged in the region of the storage battery 5.

A power switch 21 which can be user-actuated by means of the switch 20 is in turn connected to the main control electronics 9. The power switch 21 is designed for example as a MOSFET and is provided for enabling a current from the storage battery 5 to the electric motor 4.

The machine tool 1 is designed in the present case with a so-called dead man function. For this purpose, the power switch 21 can be transferred by the control device 8 between an active state, in which a user actuation of the switch 20 leads to an actuation of the electric motor 4, and an inactive state, in which a user actuation of the switch 20 does not lead to an actuation of the electric motor. To transfer the power switch 21 between the active state and the inactive state, the control element 10 is designed in the manner explained in more detail below.

In the present case, the control element 10 is operatively connected to a plurality of sensor elements 30, 31, 32, 33, 34, 35, four of which can be seen in FIG. 1 (sensor elements 34 and 35 being shown in FIG. 7 for example). The sensor elements 30, 31, 32, 33, 34, 35 are in this case each designed with a line or designed as a line. The sensor elements 30, 31, 32, 33, 34, 35, which in the present case interact with one another only via the control element 10, are of substantially comparable design here, but extend from the control element 10 into different regions of the machine tool 1.

The control element 10 has in particular a control unit and a signal generator, the signal transmitter being designed in particular to charge the sensor elements 30, 31, 32, 33, 34, 35 designed with lines with a defined voltage. The control unit is preferably designed to detect changes in charge in the at least one sensor element, whereby, for example, the presence of a hand is detected if the determined charge is greater than a defined threshold value.

A vertical direction H, a longitudinal direction L and a transverse direction Q are used in the following for a more detailed description of the machine tool 1. In the present embodiment, the longitudinal direction L relates to a direction between the storage battery 5 and the head region 2. The vertical direction H in this case substantially corresponds to an extension direction of the driven shaft 7 and the transverse direction is substantially perpendicular to the longitudinal direction L and the vertical direction H and substantially represents the extension direction of the grip device 26.

A first sensor element 30 extends from the control element 10 initially upward substantially in the vertical direction H and, from a region near the surface, forward in the longitudinal direction L toward the head region 24. The first sensor element 30, in its region extending substantially in the longitudinal direction L within the housing 2, is arranged in a region close to the surface of the housing 2 and extends substantially in the holding region 22. The first sensor element 30 extends in the longitudinal direction L substantially into a region in which the electric motor 4 is arranged.

A second sensor element 31 extends from the control element 10 initially downward substantially in the vertical direction H and, from a region near the surface, forward in the longitudinal direction L toward the head region 24. The second sensor element 31, in its region extending substantially in the longitudinal direction L within the housing 2, is again arranged in a region close to the surface of the housing 2 and extends substantially in the holding region 22. The second sensor element 31 extends in the longitudinal direction L substantially into a region in which the electric motor 4 is arranged.

Figure 3:
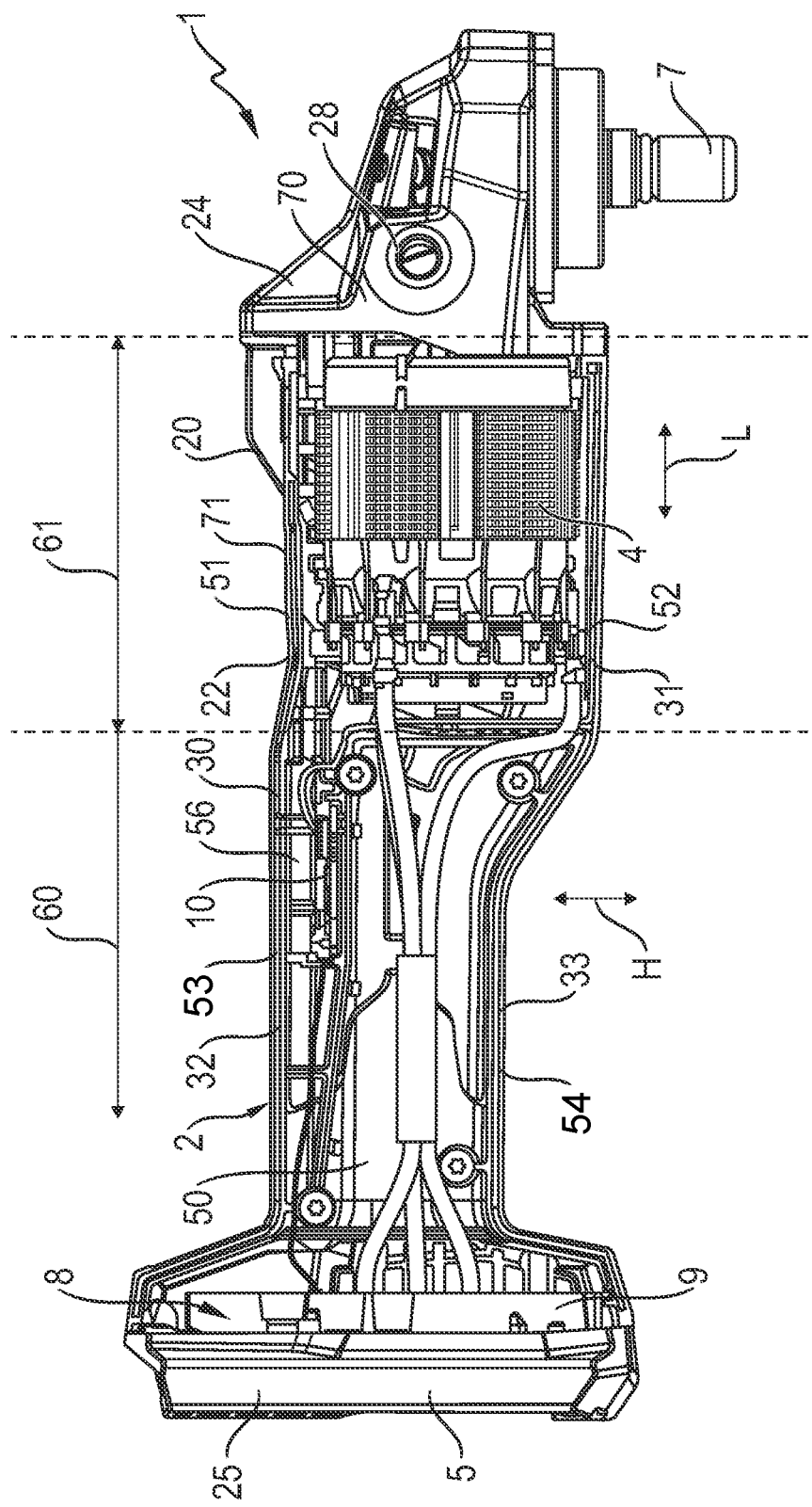
FIG. 3 is a further longitudinal sectional view of the angle grinder according to FIG. 1 and FIG. 2.
Figure 4:
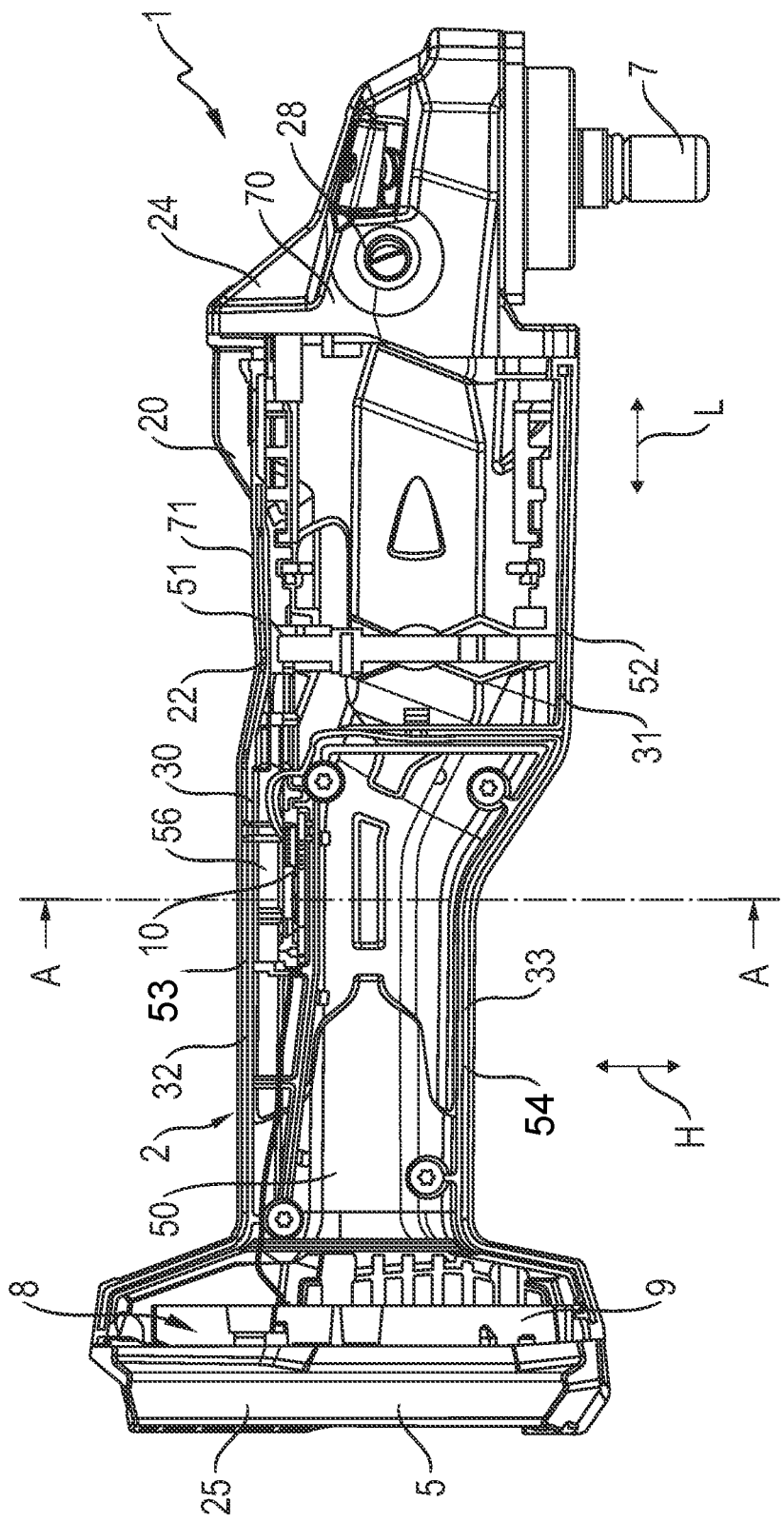
FIG. 4 is a side view of the angle grinder according to FIGS. 1 to 3.
Figure 5:
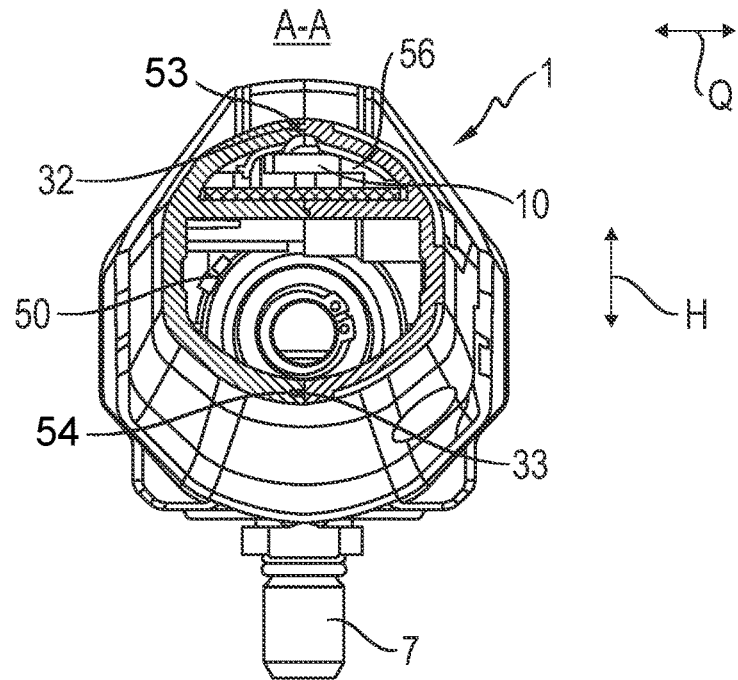
FIG. 5 is a cross-sectional view of the angle grinder according to FIGS. 1 to 4 along the line A-A in FIG. 4.
Figure 6:
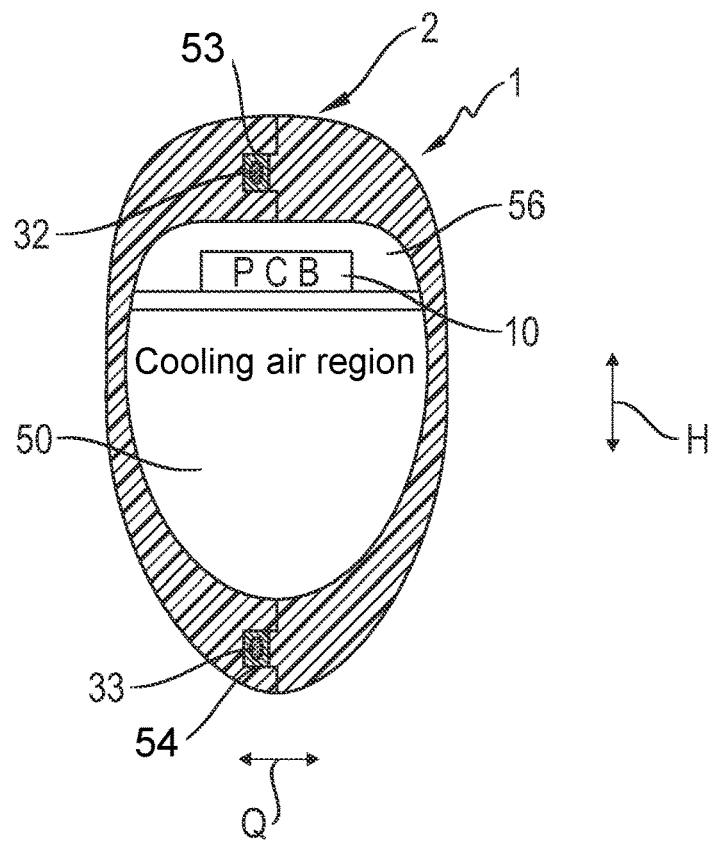
FIG. 6 is a simplified cross-sectional view of the angle grinder according to FIGS. 1 to 5 along the line A-A in FIG. 5.

A third sensor element 32 extends from the control element 10 initially upward substantially in the vertical direction H and, from a region near the surface, to the rear in the longitudinal direction L toward the base region 25. The third sensor element 32, in its region extending substantially in the longitudinal direction L within the housing 2, is arranged in a region close to the surface of the housing 2 and extends substantially in the holding region 22. The third sensor element 32 extends in the longitudinal direction L substantially into a region in which the storage battery 5 is arranged. The third sensor element 32 can also, as can be seen in FIGS. 3 and 4, extend into a base region 25 of the machine tool 1 in which the storage battery 5 is arranged.

A fourth sensor element 32 extends from the control element 10 initially downward substantially in the vertical direction H and, from a region near the surface, to the rear in the longitudinal direction L toward the base region 25. The fourth sensor element 33, in its region extending substantially in the longitudinal direction L within the housing 2, is arranged in a region close to the surface of the housing 2 and extends substantially in the holding region 22. The fourth sensor element 32 extends in the longitudinal direction L substantially into a region in which the storage battery 5 is arranged. The fourth sensor element 33 can also, as can be seen in FIGS. 3 and 4, extend into the base region 25 of the machine tool 1.

The first sensor element 30 and the third sensor element 32 are thus arranged in a region of the housing 2 that is upper with respect to the vertical direction H and the second sensor element 31 and the fourth sensor element 33 are arranged in a region of the housing 2 that is lower with respect to the vertical direction H.

FIG. 7 shows a fifth sensor element 34 and a sixth sensor element 35 in a greatly simplified manner, these likewise being connected to the control element 10 in a manner comparable to the sensor elements 30, 31, 32, 33. The fifth sensor element 34 extends from the control element 10 to the grip device 26 and in particular within the grip device 26 further into a grip region 27 of the grip device 26. It can be provided here that the fifth sensor element 34 is designed in two parts, with a first part 37 which extends inside the housing 2 and a second part 38 which extends inside the grip device 26. A connection device 28 for connecting the grip device 26 to the housing 2 is designed such that, when the grip device 26 is connected to the housing 2, the first part 37 of the fifth sensor element 34 is operatively connected to the second part 38 of the fifth sensor element 34.

The sixth sensor element 35, which can also be seen in FIG. 7, extends from the control element 10 to the protective device 12, with it being possible to select a path of the sixth sensor element 35 within the housing 2 in principle as desired, depending on the existing installation space conditions. The sixth sensor element 35 can preferably be used to determine whether the protective device 12 is connected to the housing 2, and in particular whether the protective device 12 is connected to the housing 2 in the intended manner, that is to say correctly.

In an alternative embodiment, it can also be provided that simply any desired combination of the sensor elements 30, 31, 32, 33, 34, 35 is provided. As an alternative to this, further sensor elements can also be provided, with it also being possible to arrange sensor elements for example in a region of the housing 2 which is lateral with respect to the transverse direction Q.

The sensor elements 30, 31, 32, 33, 34, 35 are presently all designed as capacitive sensor elements, it being possible to determine a change in charge in the relevant sensor element 30, 31, 32, 33, 34, 35 in conjunction with the control element 10. To determine a change in charge, it can be provided that the relevant sensor element 30, 31, 32, 33, 34, 35 is charged by the control device 8 or the control element 10 up to a defined voltage and the relevant sensor element 30, 31, 32, 33, 34, 35 is then discharged. It can be provided in this case, for example, that a capacitor which has a small capacitance comparable to the typical charging of a sensor element 30, 31, 32, 33, 34, 35 is associated with the control element 10 and it is determined how often this capacitor can be charged by the relevant sensor element 30, 31, 32, 33, 34, 35 until the relevant sensor element 30, 31, 32, 33, 34, 35 is completely discharged.

The charge that the relevant sensor element 30, 31, 32, 33, 34, 35 can absorb is substantially constant. A human hand has a capacitance which is added to the capacitance of the sensor element 30, 31, 32, 33, 34, 35 when the human hand comes within close range of the relevant sensor element 30, 31, 32, 33, 34, 35. Since the relevant sensor element 30, 31, 32, 33, 34, 35 is charged to a constant voltage, the charge absorbed by the sensor element 30, 31, 32, 33, 34, 35 increases for example in the presence of a hand so that, when the relevant sensor element 30, 31, 32, 33, 34, 35 is discharged, a greater amount of charge is present than in a state without the human hand.

In particular, the sensor elements 34 and 35 can be designed such that the respectively associated defined threshold value is exceeded when the grip device 26 or the protective device 12 is arranged in the desired manner on the housing 2 and the relevant defined threshold value is not exceeded if no grip device 26 or no protective device 12 is mounted or is not mounted on the housing 2 in the desired manner, for example.

A defined threshold value for the determined electrical charge is associated with each sensor element 30, 31, 32, 33, 34, 35, with the exceeding of the relevant threshold value being interpreted as the presence of a hand or the presence of the grip device 26 or the protective device 12.

It can be provided that the control element 10 transfers the power switch 21 from the inactive state to the active state if at least one determined electrical charge of a sensor element 30, 31, 32, 33, 34, 35 or multiple determined electrical charges of different sensor elements 30, 31, 32, 33, 34, 35 exceeds the respectively associated threshold value. Thus, a prerequisite for transferring the power switch 21 from the inactive state to the active state can be that the charge determined by the fifth sensor element 34 exceeds the corresponding threshold value and/or the charge determined by the sixth sensor element 36 exceeds the corresponding threshold value, thus requiring the presence of the grip device 26 and/or the protective device 12 to activate the power switch 21.

An actual transfer of the power switch 21 from the inactive state to the active state only occurs, for example, if, in addition to the above-mentioned prerequisite, a predefined condition is present at the sensor elements 30, 31, 32, 33 and, for example, the determined electrical charge of one or more of these sensor elements 30, 31, 32, 33 exceeds the respectively associated defined threshold value.

It can be determined, for example, whether the machine tool 1 is being held by a user in the desired manner. This can be determined by the fact that the determined charges of defined sensor elements which are arranged in corresponding regions of the machine tool 1 exceed the respectively associated threshold value and/or the determined charges of other defined sensor elements which are arranged in corresponding regions of the machine tool 1 do not exceed the respectively associated threshold value. It can thus be determined, for example, whether the machine tool is being held in the holding region 22 and in the grip region 27 and the power switch 21 is transferred to the active state only in this case, for example.

As an alternative or in addition to this, it can be provided that the power switch 21 is not transferred to the active state when a determined charge of a defined sensor element which is arranged for example in a specific region, for example in a region located close to the tool 3, exceeds the associated threshold value.

In addition, by positioning the sensor elements 30, 31, 32, 33, 34, 35 accordingly, different grip positions of a user can be determined depending on the determined charges of the respective sensor elements 30, 31, 32, 33, 34, 35, and the drive device 4 can be operated in different operating modes depending on the determined grip position. This can be provided, for example, in the case of a machine tool 1 designed as an angle grinder when using a tool 3 designed as a cutting disk or as a grinding wheel, in which the machine tool 1 is held differently and the use of the different tools 3 have different optimal speeds.

As an alternative or in addition to this, it can also be provided that the power switch 21 is only transferred from the inactive state to the active state if the electrical charge determined by a sensor element 30, 31, 32, 33, 34, 35 is less than the relevant defined threshold value. This can be provided in particular to prevent a user's hand from being in a defined region of the machine tool 1, for example. A defined region can be a region in which a user must not have their hand to operate the machine tool 1, for example. As an alternative or in addition to this, the defined region can be a danger region which is located in particular in the vicinity of the tool 3. In addition to the embodiment shown, the corresponding sensor elements 30, 31, 32, 33, 34, 35 can be arranged in the desired regions of the machine tool 1.

It can also be provided that the power switch 21 is transferred from the active state back to the inactive state if the electrical charge determined by a sensor element 30, 31, 32, 33, 34, 35 falls below the respectively defined threshold value, since this is due, for example, to a removal of a hand from the holding region 22 or the grip region 27 or to a removal of the protective device 12 and/or the grip device 12 and thus an undesirable operating state.

The fifth sensor element 34 can be provided to determine only the presence of the grip device 26. As an alternative or in addition to this, it can also be provided that the presence of a user's hand in the grip region 27 can also be determined by means of the fifth sensor element 34.

In order to reliably prevent, for example, a hand that is located in a region differing from the intended detection region, for example in a region outside the grip region 27, from leading to undesired exceeding of the associated defined threshold value, it can be provided that the region of the fifth sensor element 35 remote from the detection region is shielded and, for example, the presence of a users hand in this region does not lead to the associated defined threshold value of the fifth sensor element 34 being exceeded.

Figure 9:
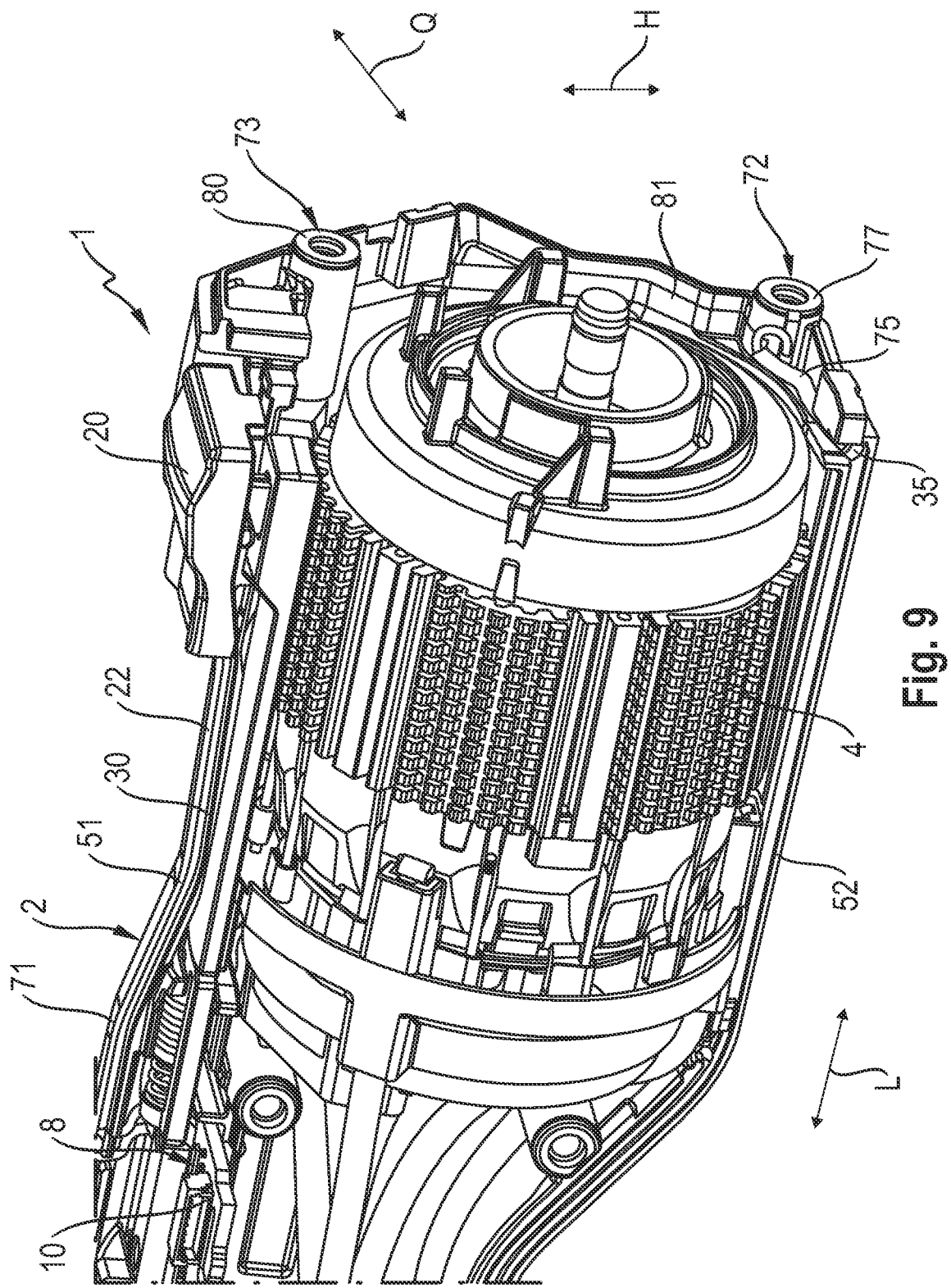
FIG. 9 is a simplified three-dimensional view of a section of the angle grinder according to FIGS. 1 to 8, in which a shielded sensor element can be seen in more detail.

A section of the hand-held machine tool 1 or the angle grinder can be seen in greater detail in FIG. 9, in which the head region 24 of the angle grinder 1, which is at least partially, in particular completely designed with a metal housing 70 (not shown in FIG. 9 but see for example FIG. 7). A rear part 71 of the housing 2 can be seen which has a plurality of connection points 72, 73 for connecting the rear part 71 of the housing 2 to the metal housing 70, two of which can be seen here.

In order to protect the fifth sensor element 34 in regions not intended for detection, for example in the region extending in the rear housing 71, from interference, undesired detections or incorrect detections for example due the drive device 4, the part of the fifth sensor element 34 extending in the region of the rear housing 71 is presently enclosed by a further element 75. The further element 75 is designed in this case as a line 75, which presently encompasses or encloses the line of the fifth sensor element 34 in a spiral shape.

In the present case, the line 75 is connected to a negative pole of the storage battery 5 for grounding. As an alternative to this, it can also be provided that the line 75 is connected to a further sensor input.

In the case of mains-operated machine tools, the line can be connected to a neutral, grounded conductor for grounding. If an AC-DC converter is provided, the line 75 can also be connected to the negative pole of the DC circuit for grounding.

The fifth sensor element 34, which is made as thin as possible to reduce parasitic capacitance effects, is connected in the region of the connection point 72 to an electrically conductive element 77 which, when the rear housing part 71 is connected to the metal housing 70, is conductively connected to a further region of the fifth sensor element 34 which extends in particular into the grip region 27 of the grip device 26.

By means of the line 75, which in particular almost completely encompasses the fifth sensor element 34 in the rear housing part 71 from the control element 10 to the connection point 72, undesired detections by the fifth sensor element 34 are reliably prevented in the region of the rear housing part 71. By arranging the line 75 accordingly, only a selected region of the sensor element 34 or also multiple regions of the sensor element 34 can also be shielded to the desired extent and the risk of an undesired detection in this region or regions can be reliably prevented. Regions of the sensor element 34 intended for detection can thus be determined very precisely.

In order to also reliably shield the region of the fifth sensor element 34 extending in the metal housing 70 and to prevent an undesired detection in this region, the metal housing 70 is grounded in the present case and connected to the negative pole of the storage battery 5 analogously to the line 75. For this purpose, a metal element 80 or metal contact is presently provided in the region of the connection point 73 and is connected to the negative pole of the storage battery 5 via a connecting element 81 in the region of the rear housing part 71. This can reliably prevent contact with the metal housing 70 leading to a detection by the fifth sensor element 34.

Accordingly, the sensor elements 30, 31, 32, 33, 34, 35 can be shielded in selected regions to prevent an undesired detection in these regions, it being possible to provide one or more further grounded elements, for example a grounded line or a grounded housing part, for this purpose.

There is greater interference for the sensor elements 30, 31, 32, 33, 34, 35 in a region 61 of the machine tool 1 in which the electric motor 4 is arranged, for example, than in a region 60 further away from the electric motor 4 (see for example FIG. 3). In order to prevent the relevant defined threshold value of the relevant sensor element 30, 31, 32, 33, 34, 35 from being exceeded due to such interference, it can be provided that the defined threshold values of the individual sensor elements 30, 31, 32, 33, 34, 35 differ from one another, with in particular those defined threshold values of sensor elements 30, 31, 34, 35 arranged in the region of the drive device 4 being greater than the defined threshold values in sensor elements 32, 33 remote from the drive device 4.

For example, it can be provided that the relevant defined threshold value is composed of the sum of a contact value that is substantially identical for all sensor elements 30, 31, 32, 33, 34, 35 and a basic signal value that is dependent on the respective ambient conditions. The basic signal value is in particular higher the greater the interference in the region of the relevant sensor element 30, 31, 32, 33, 34, 35.

It can be provided here that in particular the defined threshold values of the sensor elements 30, 31, 34, 35 which are arranged in the regions close to the drive device 4 are set or calibrated on the basis of the defined threshold values of the sensor elements 32, 33 which are arranged in regions remote from the drive device 4. The setting or calibration of the defined threshold values of the sensor elements 32, 33 can take place at defined time intervals or continuously during operation of the machine tool 1 on the basis of one or more of the defined threshold values of one or more of the sensor elements 30, 31, 34, 35.

Figure 8:
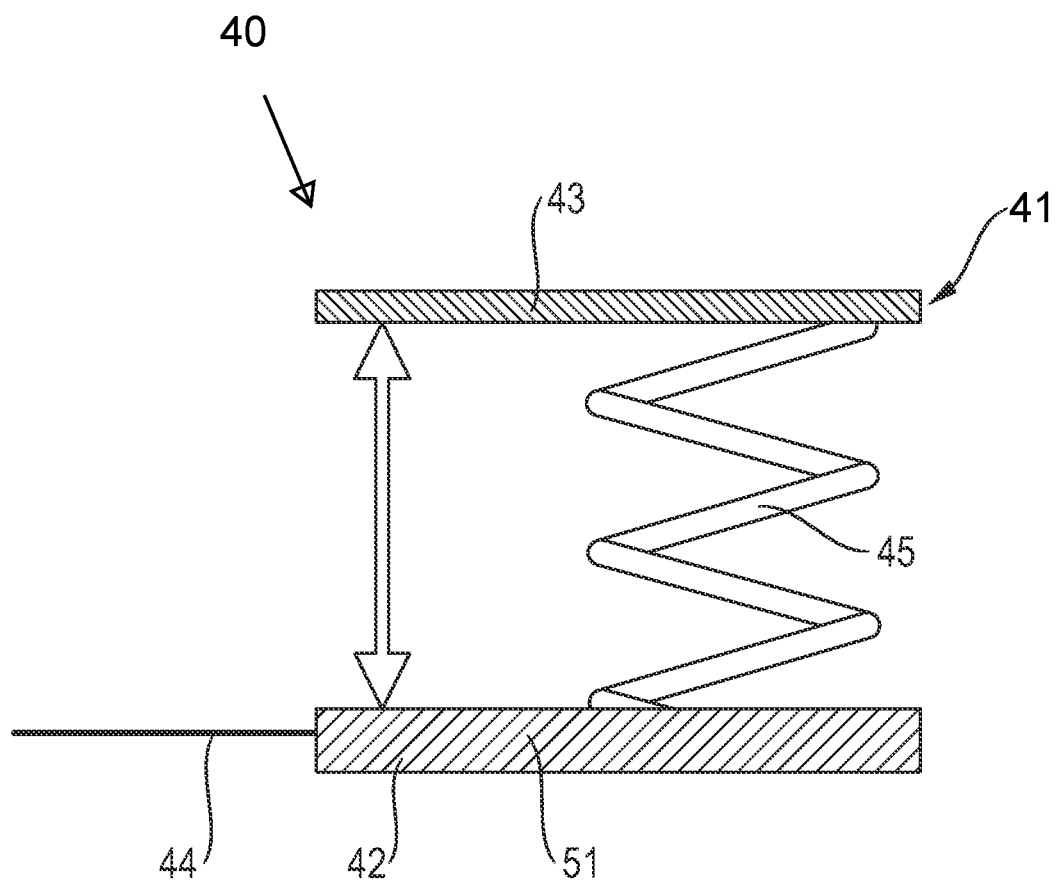
FIG. 8 is a schematic view of an operating principle of a sensor element.

FIG. 8 shows, by way of example, a section of an end region 41, remote from the control element 10, of a sensor element 40 which is fundamentally comparable to the sensor elements 30, 31, 32, 33, 34, 35 and can be used as an alternative or in addition to one or more of the sensor elements 30, 31, 32, 33, 34, 35. The end region 41 of the sensor element 40 in this case has two planar elements 42, 43, with a first element 42 being arranged at a distance from and so as to be displaceable relative to the second element 43.

The first element 42 represents a base plate, for example, which is electrically and electronically connected to a line 44 of the sensor element 40, which line in turn is provided for coupling to the control element 10. The first element 42 and the second element 43 can have a planar design, as shown in FIG. 8. In an alternative embodiment, it can also be provided that the elements 42 and 43 are designed differently and for example are curved so that the sensor element 40 can be arranged in a simple manner, for example also in the grip region 27. The sensor element 40 can partially or almost completely encompass the grip region 27 circumferentially, for example, so that a defined grip strength in the grip region 27 can be determined by means of the sensor element 40.

In the present case, the first element 42 and the second element 43 are interconnected via a spring device 45 which forces the second element 43 into a position spaced apart from the first element 42.

As an alternative or in addition to this, an in particular elastically deformable material can be arranged between the first element 42 and the second element 43, by means of which the elements 42, 43 are in particular interconnected.

The first element 42 and the second element 43 are designed in particular with a metal material. If a distance between the first element 42 and the second element 43 is changed, for example by means of an actuating element which can be actuated by a user and which is preferably arranged in the holding region 22 and/or the grip region 27 of the machine tool 1, a current electrical charge of the sensor element 40 is changed accordingly. This is due to the fact that the second element 43 together with the first element 42 represents a capacitor of which the electrical charge varies on the basis of a distance between the elements 42, 43, and increases as the distance decreases. The functional principle here corresponds to the procedure described in more detail above for determining a change in charge.

Analogously to the above explanations, a defined threshold value is provided for the electrical charge, the exceeding of which can be interpreted as the user actuating the sensor element 40. By means of the sensor element 40, depending on the selection of the spring constant of the spring device 45 or the selection of the elastically deformable material, a minimum force can easily be specified with which the actuating element connected to the second element 43 can be actuated in order to exceed the defined threshold value and to transfer the power switch 21 in the manner described above to the active state. An unintentional transfer of the power switch 21 from the inactive state to the active state can be reliably prevented in this way.

As can be seen in particular from FIGS. 2 to 5, the machine tool 1 has a main channel 50 which extends in the longitudinal direction L of the machine tool 1 and which extends substantially from a base region 51 in which the storage battery 5 and the main control electronics 9 are located to the head region 24 of the machine tool 1. Cooling air is guided through the main channel 50 and sucked in through ventilation openings in the base region 51 of the machine tool 1 by means of a fan, and is guided through the main channel 50 in the longitudinal direction L, in particular for cooling the electric motor 5.

The respective sensor elements 30, 31, 32, 33, 34, 35 are in this case each almost completely arranged in a region separated from the main channel 50. The regions are preferably designed as separate channels 51, 52, 53, 54, with each sensor element 30, 31, 32, 33 being associated with a separate channel 51, 52, 53, 54. A single sensor element 30, 31, 32, 33 is arranged in each channel 51, 52, 53, 54 in this case, although it can also be provided that two or more sensor elements are at least partially arranged in one channel. Besides the sensor elements 30, 31, 32, 33, a separate channel can also be associated with the sensor elements 34, 35 in a comparable manner.

Each channel 51, 52, 53, 54 extends here substantially from the control element 10 to an end region of the relevant sensor element 30, 31, 32, 33 that is remote from the control element 10, the channels 51, 52, 53, 54 presently being substantially completely separated from the main channel 50.

The sensor elements 30, 31, 32, 33 are separated from the main channel 50 by the channels 51, 52, 53, 54 in such a way that the sensor elements 30, 31, 32, 33 are reliably protected from interfering influences present in the main channel 50, for example in the form of moisture and/or dirt, for example conductive grinding dust. Such interfering influences could interfere with the functionality of the sensor elements 30, 31, 32, 33 and possibly lead to an incorrect detection. This is reliably prevented by the arrangement of the sensor elements 30, 31, 32, 33 in the respective channels 51, 52, 53, 54 separately from the main channel 50.

In addition to the sensor elements 30, 31, 32, 33, the control element 10 is also presently separated from the main channel 50 and arranged in a separate region or chamber 56. Thus, in a manner comparable to the sensor elements 30, 31, 32, 33, the control element 10 is protected from conditions present in the main channel 50 which could interfere with the functionality of the control element 10.

As a result of these measures, the risk of an incorrect detection by one or more of the sensor elements 30, 31, 32, 33 due to conditions present in the main channel 50 is greatly reduced in a simple manner.

In order to form the channels 51, 52, 53, 54 in a structurally simple manner, the housing 2 is presently designed in two parts in such a way that preferably each channel 51, 52, 53, 54 and the chamber 56 are jointly formed by at least two parts of the housing 2. This makes it easy to assemble the machine tool 1.

Figure 10:
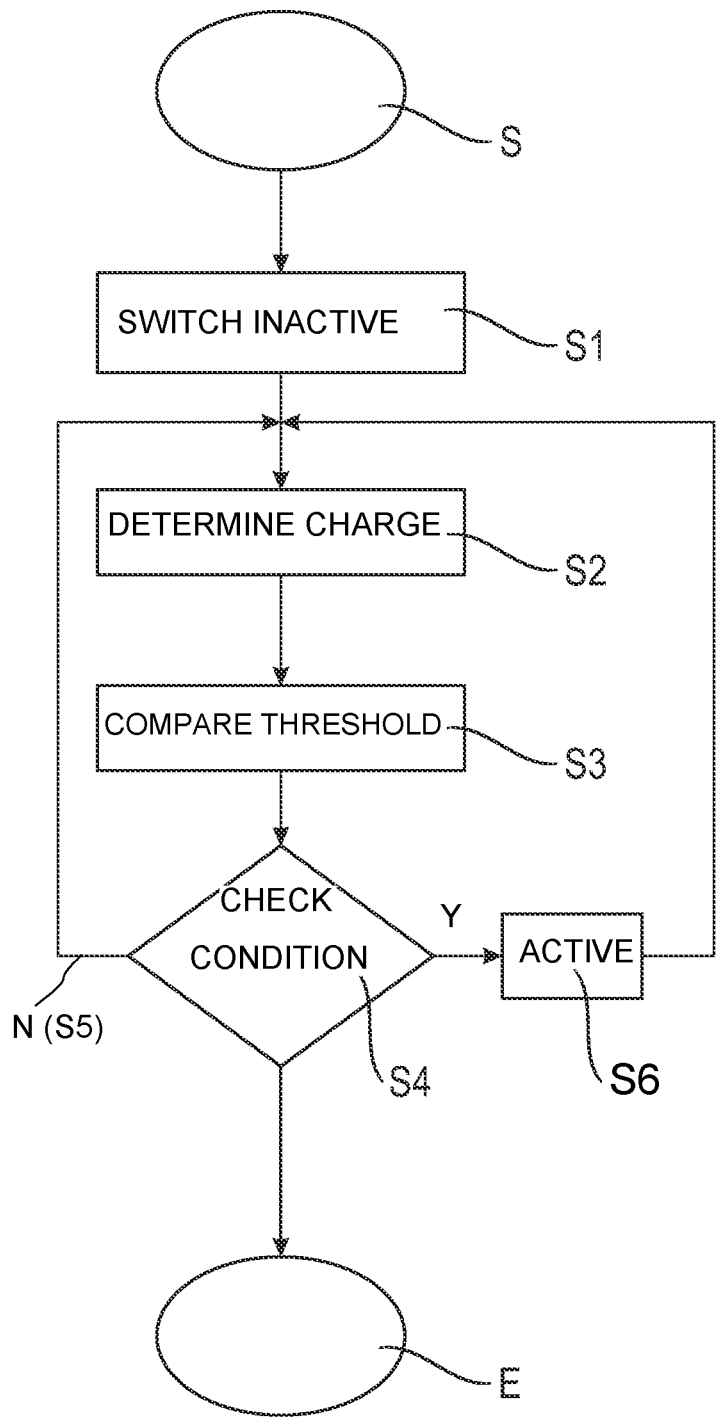
FIG. 10 is an exemplary sequence of a method for actuating the angle grinder according to FIGS. 1 to 9.

FIG. 10 shows an example of an embodiment of a method for operating the machine tool 1.

The method begins at the start S, in particular when a user actuates the switch 20, for example. In a first step S1, the power switch 21 is set to the inactive state. The power switch 21 is preferably preset to the inactive state.

In a second step S2, the electrical charges of the respective sensor elements 30, 31, 32, 33, 34, 35, 40 are determined and these are compared in step S3 with the respectively associated defined threshold values. In step S4, it is checked whether a predefined condition exists between the determined electrical charges and the respective threshold values of the sensor elements 30, 31, 32, 33, 34, 35, 40, as described in more detail above by way of example.

If the query in step S4 is negative and the predefined condition is not present, the power switch 21 is transferred to the inactive state or left in the inactive state in step S5 and the method is continued with step S2.

If the query result in step S4 is positive, the power switch 21 is transferred to the active state or left in the active state in step S6, so that a user actuation of the switch 20 leads to an activation of the drive device 4. The method is then continued with step S2.

In step E, the method is ended in particular when there is no longer any user actuation.

What is claimed is:

1. A method for actuating a hand-held machine tool having a drive, a tool bringable into operative connection with the machine tool actuatable via the drive, a controller for actuating the drive, and a capacitive first sensor and a capacitive second sensor operatively connected to the controller, the method comprising the following steps:
   determining a first electrical charge of the first sensor;
   determining a second electrical charge of the second sensor;
   comparing the determined first electrical charge of the first sensor with a defined first threshold value;
   comparing the determined second electrical charge of the second sensor with a defined second threshold value differing from the first threshold value;
   enabling, via the controller, actuation of the drive when the first electrical charge of the first sensor is greater than the defined first threshold value or the second electrical charge of the second sensor is greater than the defined second threshold value.

2. The method as recited in claim 1 wherein the first threshold value is set on the basis of the second threshold value.

3. The method as recited in claim 1 wherein the first threshold value is set on the basis of the second threshold value at defined time intervals.

4. The method as recited in claim 1 wherein the first threshold value is set on the basis of the second threshold value continuously during operation of the machine tool.

5. The method as recited in claim 1 wherein the determination of the electrical charge of the first or second sensor or a further sensor element includes the following steps:
   charging a relevant sensor; and
   discharging the relevant sensor; and
   determining an electrical charge of the relevant sensor via the controller.

6. A hand-held machine tool for carrying out the method as recited in claim 1, the hand-held machine tool comprising: the drive, the controller and the first and second sensors.

7. The hand-held machine tool as recited in claim 6 wherein the first sensor is arranged in a region of the drive.

8. The hand-held machine tool as recited in claim 7 wherein the second sensor is arranged in a region of the machine tool remote from the drive.

9. The hand-held machine tool as recited in claim 6 wherein the second sensor is arranged in a region of the machine tool remote from the drive.

10. The hand-held machine tool as recited in claim 6 wherein the control includes a control element, the first and second sensors being operatively connected to the control element.

11. The hand-held machine tool as recited in claim 10 wherein the control element has a control unit and a signal generator.

12. The hand-held machine tool as recited in claim 6 further comprising a power switch operatively connected to the controller, the controller being designed to transfer the power switch between an inactive state and an active state, with a user actuation of the power switch in the active state of the power switch leading to an actuation of the drive.

* * * * *